United States Patent
Li et al.

(10) Patent No.: US 6,735,749 B2
(45) Date of Patent: May 11, 2004

(54) (DESIGN RULE CHECK)/(ELECTRICAL RULE CHECK) ALGORITHMS USING A SYSTEM RESOLUTION

(75) Inventors: Mu-Jing Li, Sunnyvale, CA (US); Amy Yang, Saratoga, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 0 days.

(21) Appl. No.: 10/103,521

(22) Filed: Mar. 21, 2002

(65) Prior Publication Data

US 2003/0182644 A1 Sep. 25, 2003

(51) Int. Cl.$^7$ ............................................... G06F 17/50
(52) U.S. Cl. .................... 716/5; 703/1; 716/2; 716/11
(58) Field of Search ..................... 716/2, 5, 11; 703/1

(56) References Cited

U.S. PATENT DOCUMENTS

| | | |
|---|---|---|
| 4,613,940 A | 9/1986 | Shenton et al. |
| 4,630,219 A | 12/1986 | DiGiacomo et al. |
| 4,774,461 A | 9/1988 | Matsui et al. |
| 5,062,054 A | 10/1991 | Kawakami et al. |
| 5,249,134 A | 9/1993 | Oka |
| 5,416,722 A | 5/1995 | Edwards |
| 5,481,473 A | 1/1996 | Kim et al. |
| 5,497,334 A | 3/1996 | Russell et al. |
| 5,519,628 A | 5/1996 | Russell et al. |
| 5,528,508 A | 6/1996 | Russell et al. |
| 5,586,046 A | 12/1996 | Feldbaumer et al. |
| 5,689,433 A | 11/1997 | Edwards |
| 5,689,435 A | * 11/1997 | Umney et al. .................. 703/1 |
| 5,706,295 A | 1/1998 | Suzuki |
| 5,781,446 A | 7/1998 | Wu |
| 5,787,006 A | 7/1998 | Chevallier et al. |
| 5,809,037 A | 9/1998 | Mathewson |
| 5,812,415 A | 9/1998 | Baisuck |

(List continued on next page.)

OTHER PUBLICATIONS

U.S. patent application Ser. No. 10/121,322, Li et al., filed Apr. 12, 2000.

*Primary Examiner*—Vuthe Siek
*Assistant Examiner*—Thuan Do
(74) *Attorney, Agent, or Firm*—Zagorin, O'Brien & Graham LLP

(57) ABSTRACT

Method and apparatus for checking integrated circuit designs. In particular, one embodiment of the present invention is a method that for checking integrated circuit design files using (design rule check)/(electrical rule check) files (DRC/ERC files) wherein design objects are disposed on a grid having a system resolution, the method comprising steps of: (a) growing one or more rectangular boxes having at least two sides of length equal to the system resolution outward or inward from one or more of an edge of a design object and a side of a design object; (b) performing one or more of a spacing DRC/ERC check and an overlay DRC/ERC check; and (c) identifying checks relating to the rectangular boxes.

12 Claims, 3 Drawing Sheets

U.S. PATENT DOCUMENTS

| | | |
|---|---|---|
| 5,812,561 A | 9/1998 | Giles et al. |
| 5,838,335 A | 11/1998 | Hamamoto |
| 5,984,510 A | 11/1999 | Guruswamy et al. |
| 5,987,086 A | 11/1999 | Raman et al. |
| 5,987,240 A | 11/1999 | Kay |
| 5,999,717 A | 12/1999 | Kaufmann et al. |
| 6,006,024 A | 12/1999 | Guruswamy et al. |
| 6,009,250 A | 12/1999 | Ho et al. |
| 6,011,911 A | 1/2000 | Ho et al. |
| 6,026,224 A | 2/2000 | Darden et al. |
| 6,055,366 A | 4/2000 | Le et al. |
| 6,078,737 A | 6/2000 | Suzuki |
| 6,115,546 A | 9/2000 | Chevallier et al. |
| 6,117,179 A | 9/2000 | Tan et al. |
| 6,182,020 B1 | 1/2001 | Fairbanks |
| 6,185,726 B1 | 2/2001 | Chou |
| 6,189,131 B1 | 2/2001 | Graef et al. |
| 6,209,123 B1 | 3/2001 | Maziasz et al. |
| 6,269,467 B1 | 7/2001 | Chang et al. |
| 6,275,971 B1 | 8/2001 | Levy et al. |
| 6,321,369 B1 | 11/2001 | Heile et al. |
| 6,324,673 B1 * | 11/2001 | Luo et al. ............ 716/11 |
| 6,370,679 B1 | 4/2002 | Chang et al. |
| 6,373,975 B1 | 4/2002 | Bula et al. |
| 6,378,110 B1 | 4/2002 | Ho |

* cited by examiner

(DESIGN RULE CHECK)/(ELECTRICAL RULE CHECK) ALGORITHMS USING A SYSTEM RESOLUTION

TECHNICAL FIELD OF THE INVENTION

One or more embodiments of the present invention pertain to method and apparatus for checking integrated circuit (IC) designs.

BACKGROUND OF THE INVENTION

As the size of integrated circuit (IC) features continues to shrink, and the demand for increased circuit density has correspondingly increased, IC designers have been turning to automated design tools, layout tools, and checking tools. Fabrication of ICs is dependent upon the creation of a set of "masks" used during fabrication, where each mask in the set represents a different step in the fabrication (typically an addition or deletion of material). A digitized representation of an image of a mask is commonly called a "mask layer" or simply a "layer". Each layer is comprised of a set of geometric shapes representing a desired configuration of materials such as metal, polysilicon, or substrate in a finished IC. For example, layers can represent the deposition of metal, or the etching away of resistive material between two layers of metal so that a "via" is opened.

As is well known, semiconductor physical design follows design rules that are defined, for example, by an integrated circuit manufacturing factory (for example, a foundry) to fabricate the design using a particular manufacturing technology. Thus, design rules are restrictions, or guidelines, within which the design can be implemented so the foundry can use its manufacturing technology to fabricate ICs according to the design. In general, before a layout design of a particular level is transferred onto a photolithography reticle, the design is in the form of a digital computer file, where each of the features has a plurality of associated X and Y coordinates that define their location on a mask. A key task in designing a quality IC is to ensure that the designed features obey the design rules and electrical rules (for example, rules specifying connectivity). For example, and without limitation, design rules checks may identify: (a) layers having a floating metal; (b) devices having a partial gate; (c) metal features with a width larger than a predetermined amount; (d) violations of width, spacing, enclosure, and hole design rules; (e) violations of slot rules; (f) violations of dead zone rules; and (g) special gate rules. Accordingly, because ICs typically comprise a large number features, designers typically employ commercially available software products to perform operations known as "design rule checks" (DRCs) and/or "electrical rule checks" (ERCs). In general, one or more DRCs/ERCs are applied to the features of each layer: (a) directly by measuring their shapes and their relationships to each other, and/or (b) indirectly by creating intermediate layers (also known as "derived layers"). Exemplary DRC/ERC processing may include determinations of whether certain minimum interfeature spacings have been violated, whether successive levels are overlapping, and so forth. Derived layers often are more amenable to design rule checking than the original layers, and can be used in the creation of subsequently derived layers.

As is known, a physical computer aided design ("CAD") environment is set up—based on design rules and electrical rules—to implement an IC design, and to check whether the design meets the design and electrical rules. In a DRC/ERC file, DRCs/ERCs often entail generating supplemental features or lines to develop checks that separate one type of feature from others, or that distinguish a real DRC/ERC violation from one that is a false error.

In light of the above, there is a need in the art for method and apparatus for generating such supplemental features and lines that enable a designer to create efficient DRCs/ERCs.

SUMMARY OF THE INVENTION

One or more embodiments of the present invention advantageously satisfy the above-identified need in the art. Specifically, one embodiment of the present invention is a method for checking integrated circuit design files using (design rule check)/(electrical rule check) files (DRC/ERC files) wherein design objects are disposed on a grid having a system resolution, the method comprising steps of: (a) growing one or more rectangular boxes having at least two sides of length equal to the system resolution outward or inward from one or more of an edge of a design object and a side of a design object; (b) performing one or more of a spacing DRC/ERC check and an overlay DRC/ERC check; and (c) identifying checks relating to the rectangular boxes.

DETAILED DESCRIPTION

One or more embodiments of the present invention pertain to method and apparatus for checking integrated circuit (IC) designs that are in the form of digital computer files, which files delineate features and their location in a mask layer (also referred to as a layer). The checking operations determine whether such IC designs obey design rules relating to a manufacturing technology (for example, to determine whether predetermined spacing relations between features are maintained) and whether such IC designs obey electrical rules (for example, to detect possible misalignments between integrated circuit layout levels). Preferably, one or more of such embodiments are embodied in a computer implemented design rule checker (DRC)/electrical rule checker (ERC). In the following description, numerous specific details are set forth in order to provide a thorough understanding of the present invention. It will be understood, however, by one or ordinary skill in the art, that some embodiments of the present invention may be practiced without some or all of these specific details. In other instances, well known process operations have not been described in detail in order not to obscure an understanding of the present invention.

A central component of the present invention is the implementation of DRC/ERC verification software for checking IC design features that are characterized as coordinates in digital computer files. Therefore, one or more embodiments of the present invention are well suited to adapt the capabilities of DRC/ERC verification software to perform well known operations, such as, for example, and without limitation, sizing operations, minimum area comparisons, and so forth.

Figure 1:
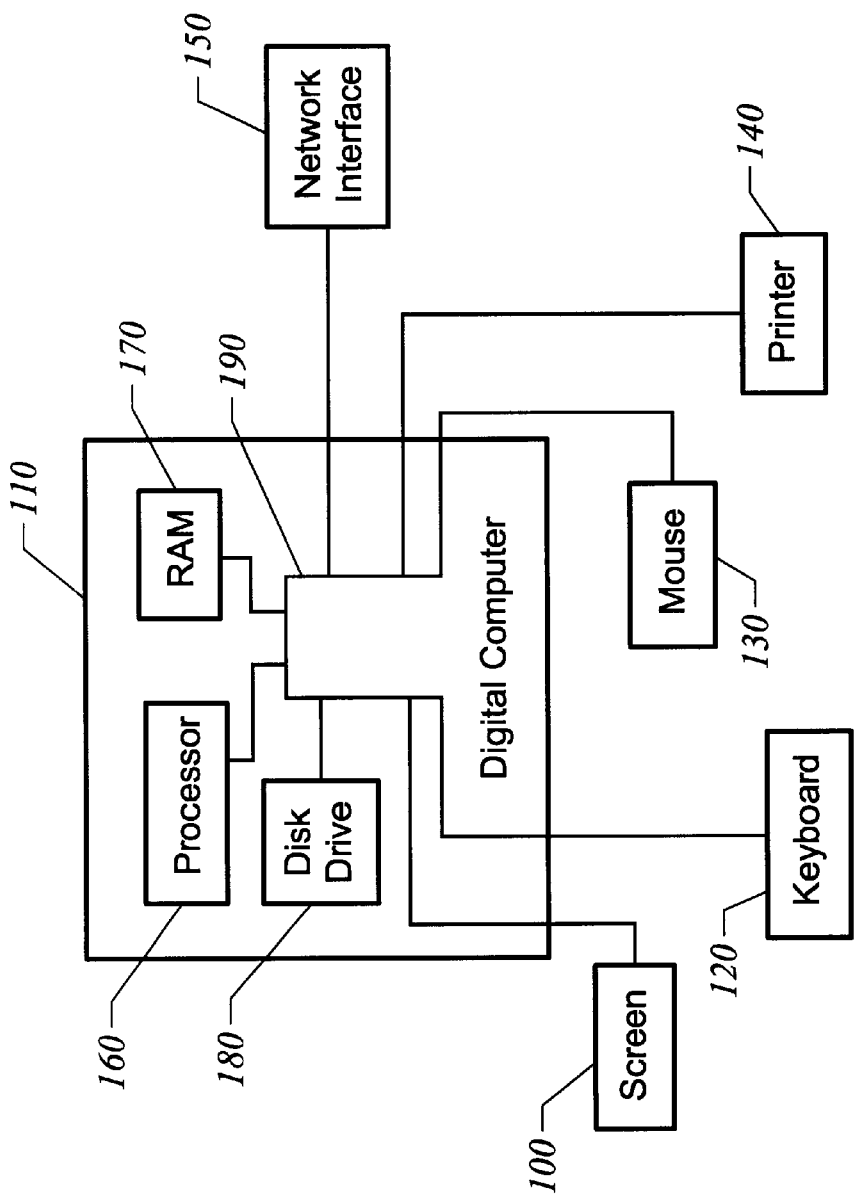
FIG. 1 is a block diagram of system 1000 that is fabricated in accordance with one embodiment of the present invention.

FIG. 1 is a block diagram of design verification computer system 1000 that is used to carry out processing in accordance with one or more embodiments of the present invention. As shown in FIG. 1, system 1000 includes display screen (or monitor) 100, digital computer 110, keyboard 120, mouse 130, printer 140, and network interface 150. Digital computer 110 includes familiar computer components such as, for example, and without limitation, processor 160, memory storage devices such as a random access memory (RAM) 170 and disk drive 180, and system bus 190 that interconnects the above-identified components. Note that: (a) mouse 130 is but one example of a graphical input device—a trackball is another example; (b) a modem is but one example of network interface 150 that enables system 1000 to be coupled to a network—a network interface card is another example; and (c) RAM 170 and disk drive 180 are examples of a computer-readable memory (i.e., a tangible medium) for storage of computer code and computer programs—other types of computer-readable media include floppy disks, removable hard disks, optical storage media such as CD-ROMS, and semiconductor memories such as flash memory and read-only-memories (ROMs). RAM 170 is used by processor 160 as a general storage area and as scratch-pad memory. It can also be used to store input data and processed data. ROM can be used to store instructions or program code followed by processor 160 as well as other data. Network interface 150 is used to send and receive data over a network connected to other computer systems—an interface card or similar device and appropriate software implemented by processor 160 can be used to connect computer system 1000 to an existing network and transfer data according to standard protocols.

Digital computer 110 can be a personal computer (such as an IBM compatible personal computer, a Macintosh computer, or Macintosh compatible computer), a workstation computer (such as a Sun Microsystems workstation or a Hewlett-Packard workstation), or some other type of computer. In one such embodiment, computer system 1000 includes an UltraSparc computer running the Solaris operating system from Sun Microsystems of Sunnyvale, Calif. and Vampire software from Cadence Design Systems, Inc.

FIG. 1 is representative of but one type of computer system that may be used to implement one or more embodiments of the present invention. It will be readily apparent to one of ordinary skill in the art that many system types and hardware and software configurations including more or fewer components are suitable for use in conjunction with the present invention, such as an HP-755/125 computer from Hewlett-Packard Corporation. Processor 160 is a general purpose digital processor which controls the operation of computer system 1000. Processor 160 can be a single-chip processor, or it can be implemented with multiple components. Using instructions retrieved from memory, processor 160 controls the reception and manipulation of input data, and the output and display of data on output devices. According to one or more embodiments of the present invention, a particular function of processor 160 is to assist in the DRC/ERC operations.

One or more embodiments of the present invention may be fabricated as computer readable code on a computer readable medium. The computer readable medium is any data storage device that can store data, which data can be thereafter be read by a computer system. Examples of a computer readable medium include, without limitation, read-only memory, random-access memory, CD-ROMs, magnetic tape, and optical data storage devices. Further, the computer readable medium can also be distributed over a network of coupled computer systems so that the computer readable code is stored and executed in a distributed fashion.

In accordance with one embodiment of the present invention, a physical lay-out of a circuit design resides in a memory storage device in design verification computer system 1000. One or more embodiments of the present invention may utilize various computer-implemented operations involving data stored in a computer system. These operations are often referred to in terms, such as producing, identifying, determining, or comparing. Any of the operations described herein that form part of an embodiment of the present invention typically involve useful machine operations. Further, some embodiments of the present invention relates to an apparatus for performing these operations. In particular, such apparatus may be specially constructed for the required purposes, or it may be a general purpose computer selectively activated or configured by a computer program stored in the computer. In particular, various general purpose machines may be used with computer programs written in accordance with the teachings herein, or it may be more convenient to construct a more specialized apparatus to perform the required operations.

In accordance with one or more embodiments of the present invention, one or more DRCs/ERCs that comprise a DRC/ERC file entail generating performing operations, for example, and without limitation, that entail generating supplemental features or lines, so that the checks can: (a) separate one type of feature from others, or (b) distinguish a real DRC/ERC violation from a false violation. Thus, some embodiments of the present invention relate to methods for performing DRCs/ERCs, and some embodiments of the present invention relate to the DRCs/ERCs.

As is known, IC designs are laid out on a design grid, for example, in X-Y coordinates, where a design grid spacing is pre-defined, for example, 0.01 micron, known as a grid. Further, IC designs are constrained to having each feature vertex lie on the grid. In particular, this means that for any on-grid design, the minimum length or width of a feature or the minimum length of a line a user can draw is one design grid. For purposes of checking a design, this means that any off-grid feature will be flagged as an error. In particular, this means that any off-grid vertex will be flagged as an error.

As is further well known, a typical CAD environment that performs the DRCs/ERCs uses a predetermined unit of distance to separate the smallest units of a design from each other, this predetermined unit of distance is often referred to as a system resolution or resolution unit. Typically, the resolution unit is set to one tenth of one design grid to make sure that the DRCs/ERCs can be performed accurately.

One or more embodiments of the present invention use the system resolution as a "magic" number to create supplemental geometries and sizing fractions to implement DRC/ERC checking methods. Advantageously, the resolution unit is small enough not to cause any false errors, but large enough for the CAD system to "find" it. Further, since the resolution unit is unique, supplemental geometries and lines using it can be separated from design features. In the following, the resolution unit is set to one-tenth of the grid unit, and will be referred to as a "TenthGrid."

The following provides one embodiment of the present invention that illustrates the use of the TenthGrid. In accordance with this embodiment of the present invention, a DRC/ERC determines which design objects satisfy a specified width definition. For example, one such check entails identifying all design objects corresponding to a metal (referred to as metal design objects) that have a width greater than or equal to a predetermined value. For example, the predetermined width is designated as MxWide, where MxWide may be measured in microns. The following steps comprise a method for performing the check.

Step 1: create a variable size_factor=MxWide/2−TenthGrid

Step 2: perform a sizing operation on the metal design object that entails decreasing the area of the metal design object. Specifically, the sizing operation decreases each side of the metal design object by an amount equal to size_factor.

Step 3: perform the same sizing operation performed in Step 2, however, this time the sizing operation increases the area of the metal design object. Specifically, the sizing operation increases each side of the metal design object by an amount equal to size_factor.

As one can readily appreciate from the above, if the width of the metal design object is less than 2*size_factor, it will disappear in Step 2. Thus, all metal objects that do not disappear after performing the above-described DRC/ERC have a width greater than or equal to MxWide. To understand how the above-described method operates to prevent false errors, consider an example where MxWide=7.0$\mu$, the design grid spacing=0.01$\mu$, the system resolution or resolution unit=0.001$\mu$, and the TenthGrid=system resolution=design grid spacing/10=0.001$\mu$.

Using this example, after performing Step 1 above, size_factor=7.0$\mu$/2−0.001$\mu$=3.499$\mu$. As a result, after performing Step 2 above, the width of the metal design object is reduced by an amount equal to 6.998$\mu$ (note that the amount is two (2) times size_factor since each side of the metal design object is decreased by size_factor). Note that all on-grid metal design objects have metal widths that are 6.99$\mu$ or less or 7.0$\mu$ or greater, i.e., it is impossible for an on-grid metal design object to have a width of 6.998$\mu$. Thus, after performing Step 2 above, all metal design objects having widths that are 6.99$\mu$ or less (i.e., reducing the widths of such metal design objects by 6.998$\mu$ will cause them to disappear) will be phased out of an object-to-check-pool ("OTCP"). However, after performing Step 2 above, all metal design objects having widths that are 7.0$\mu$ or larger (i.e., reducing the widths of such metal design objects by 6.998$\mu$ will not cause them to disappear) will remain in the OTCP. Therefore, when Step 3 above is performed, metal design objects with metal width$\geq$7.0$\mu$ remain in the OTCP.

The following examples illustrate how the use of TenthGrid in Step 1 of the above-described method advantageously prevents false errors, i.e., not using TenthGrid can lead to false errors. As a first example, assume that one uses the above-described method, however, one change is that Step 2 now creates size_factor=Mxwide/2. Then, in light of the previous specific example where MxWide=7.0$\mu$, performing Step 2 will create false errors since metal design objects having a width of 7.0$\mu$ will be phased out of the OTCP (this is because reducing the widths of such metal design objects by 7.0$\mu$ will cause them to disappear). As a second example, assume that one uses the above-described method, however, one change is that Step 2 now creates size_factor=MxWide/2−design grid spacing. Thus, in light of the previous specific example where MxWide=7.0$\mu$ and design grid spacing=0.01$\mu$, size_factor=3.49$\mu$. Then, performing Step 2 will cause false errors since metal design objects having a width of 6.99$\mu$ will not be phased out of the OTCP (this is because reducing the widths of such metal design objects 6.98$\mu$ will not cause them to disappear).

The following provides another embodiment of the present invention that illustrates the use of the TenthGrid as it relates to floating point numbers. A problem occurs whenever the operation == is used to determine whether a floating point number stored in memory is equal to a predetermined result, in that false errors sometimes occur. However, in accordance with this embodiment of the present invention, advantage of the fact that every vertex of a design object must fall on the design grid is taken to provide an inventive method. To illustrate the inventive method, consider its use in a case where all edge lengths of a design object are required to be equal to a predetermined amount VxRLength. In accordance with this embodiment of the present invention, instead of using the operation ==, the following operation is used.

VxRLength−TenthGrid<length<VxRLength+TenthGrid.

To see how this works in a specific example, assume that VxRLength=0.32$\mu$, and that the design grid spacing=0.01$\mu$. Then, in this example, the above-described operation becomes 0.319$\mu$<length<$\mu$0.321$\mu$.

The following provides still another embodiment of the present invention that relates to checking edges. Currently available verification software is primarily based on performing operations that are referred to as "polygon" operations. For example, such polygon operations include, without limitation, determining spacing between polygon design objects, and determining overlap between polygon design objects. As a result, such currently available verification software provides significant hurdles that have to be overcome when DRCs/ERCs require checking edges. That is, such currently available verification software provides operations that can find desired edges (a find-edge operation), operations that can grow an area starting from an edge (a grow-area operation), and operations that can grow the length of an edge (a grow-edge-length operation), but there are no checking operations. Advantageously, this embodiment of the present invention provides methods for performing design rule checks that involve edges. In accordance with this embodiment, inventive supplemental structures are created using the existing operations (for example, and without limitation, a find-edge operation, a grow-area operation, and a grow-edge-length operation), then methods built on combinations of existing operations such as, for example, and without limitation, polygon operations are carried out on the inventive supplemental structures. In accordance with this embodiment of the present invention, using an inventive dimension to create the inventive supplemental structures, enables the results of the methods to be identified with the inventive supplemental structures without interfering, or being confused, with the original design data.

In accordance with one such embodiment of the present invention, an edge is identified in accordance with any one of a number of methods that are well known to those of ordinary skill in the art. Then, the identified edge is expanded into an inventive supplemental structure in accordance with any one of a number of methods that are well known to those of ordinary skill in the art, which inventive supplemental structure comprises a rectangle having two edges whose length=TenthGrid. As described above, this inventive supplemental structure (referred to herein as a TenthGrid box) will not be confused or mixed up with the original design data since two points of the TenthGrid box are off-grid, i.e., the two points that are not on the identified edge. Advantageously, in accordance with this embodiment, the fact that the TenthGrid box includes off-grid points is used to identify the edge that includes the off-grid points. Further, the TenthGrid box can be used to create further DRCs/ERC in accordance with further embodiments of the present invention.

The following provides another embodiment of the present invention that provides one example of a method that uses a TenthGrid box. This embodiment provides a method for performing a spacing check for "an end of a metal slot to an edge of a metal." For example, this check relates to a metal area in which a number of metal slots are formed, for example, by etching the metal area. A difficulty that arises in using currently available verification software to perform this check is that such currently available verification software does not provide operations that can apply a different design rule spacing check: (a) in a first direction, i.e., between a side of the metal slot and an edge of the metal; and (b) in a second direction, i.e., between an end of the metal slot and an edge of the metal. In particular, this is because there are no checking operations that distinguish between these design rule spacing checks in the two different directions. Specifically, the currently available verification software provides an enclosure operation, i.e., a checking operation that determines the distance of the side and end of the metal slot from the edges of the metal. However, this checking operation merely determines whether the metal encloses the slot by greater than a predetermined amount, i.e., the checking operation uses the same checking distance for all directions.

In accordance with this embodiment of the present invention, a spacing check is provided that enables one to use the enclosure operation and identify checks done in a first direction and checks done in a second direction. In accordance with this embodiment, to do the spacing check between an end of the metal slot to an edge of the metal, the end edge of the metal slot is expanded into a rectangle having a width equal to TenthGrid, i.e., by forming a TenthGrid box. Then, the prior art enclosure operation is performed. The results from the TenthGrid box are filtered by identifying boxes causing errors because the TenthGrid wide edges of the TenthGrid box are off-grid, and, for these boxes, by identifying boxes causing errors where a projection length of the side is greater than the TenthGrid. This method provides a spacing check for the second direction. Note that this method may be used to provide a spacing check for the first direction by growing the TenthGrid box from the side of the metal slot. The following summarizes the method.

Step 1: select slot design objects having an edge of a predetermined length (for example, M14SlotWidth) by requiring:

(M14SlotWidth−TenthGrid)<edgelength<(M14SlotWidth+TenthGrid)

Step 2: generate a TenthGrid box having two sides of width=TenthGrid; preferably the TenthGrid box is grown inside the edge Step 3: perform an enclosure operation Step 4: filter the results: (a) by identifying boxes causing errors because the TenthGrid wide edges of the TenthGrid box are off-grid; and (b) for these boxes, by identifying boxes causing errors where a projection length of the side is greater than TenthGrid. As one can readily appreciate from this, this filter requirement has identified the desired edge. This method may be used to provide the spacing check for the first direction by growing a TenthGrid box from the side of the metal slot.

Figure 3:
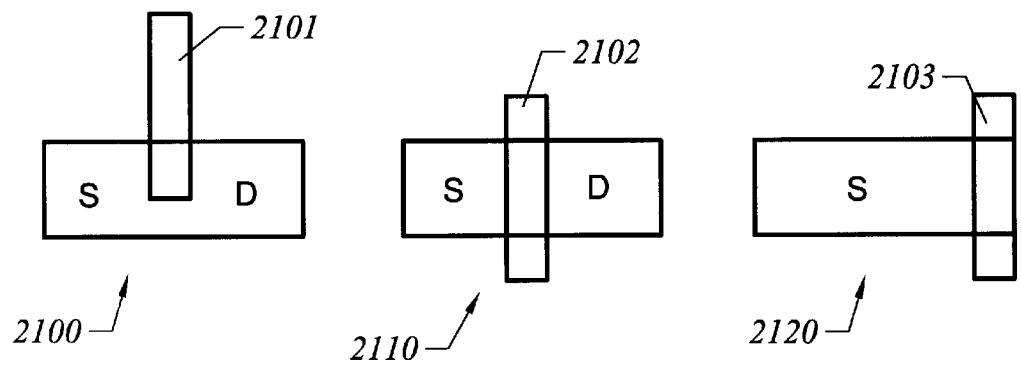
FIG. 3 shows an MOS device and two MOS devices having partial gates that are checked in accordance with one or more embodiments of the present invention.

The following provides another embodiment of the present invention that provides another example of a method that uses a TenthGrid box. This embodiment provides a method for detecting an MOS device having a partial gate. FIG. 3 shows a top view of MOS device 2110 where polysilicon design object 2102, source design object S, and drain design object D form a complete gate. FIG. 3 also shows a top view of MOS devices 2100 and 2120 having partial gates. In accordance with one embodiment of the inventive method, expand the edges of the polysilicon by growing TenthGrid boxes. Then perform a DRC to determine whether the TenthGrid boxes formed at the ends overlap the source or drain. For MOS device 2100, a TenthGrid box formed on an end of polysilicon design object 2101 overlaps the source and/or the drain. This indicates a partial gate because this would not occur for MOS device 2110. In accordance with another embodiment of an inventive method, expand the sides of the polysilicon design object by growing TenthGrid boxes. Then, perform a DRC to determine whether the TenthGrid boxes formed at the sides overlap the source or the drain. For MOS device 2120, a TenthGrid box formed on a side of polysilicon design object 2103 does not overlap the source or the drain. This indicates a partial gate because this would not occur for MOS device 2110. Further, and in accordance with the present invention, since the overlap functions are performed with TenthGrid boxes, there is no confusion with real design data.

Figure 2:
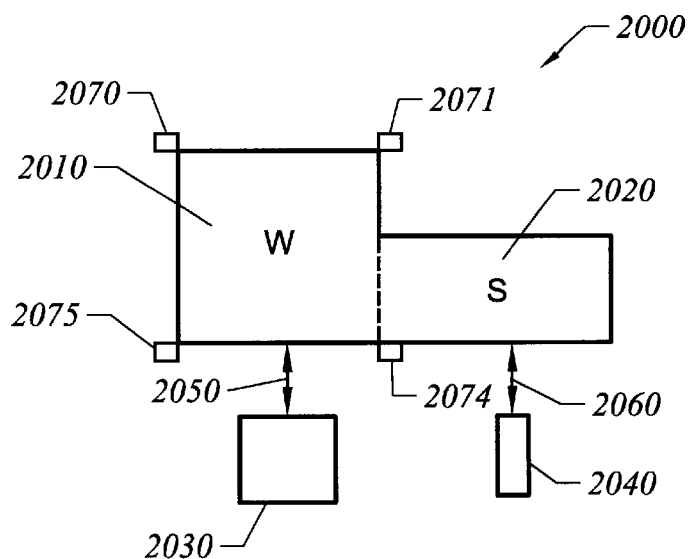
FIG. 2 shows a notched metal design object that is checked in accordance with one or more embodiments of the present invention.

The following provides another embodiment of the present invention that provides still another example of a method that uses a TenthGrid box. This embodiment provides a method for identifying irregularly shaped design objects such as a notch edge of, for example, a metal design object. Currently available verification software typically will break the irregular shaped design objects into a number of smaller design objects which are mere artifices. Nevertheless, in accordance with the currently available verification software, many DRCs/ERCs are performed because the verification software sees many different objects. Thus, in order to save processing time, it would be advantageous to filter out those objects that are artificial from those objects that are real. To understand this problem and the inventive solution, consider the notched design object 2000 shown in FIG. 2. The currently available verification software will break notched metal design object 2000 into two metal design objects: wide metal design object 2010 and smaller metal design object 2020. This causes a problem, among other reasons, because design rules typically have different spacing rules for a wide metal design object (for example, distance 2050 between metal design object 2030 and wide metal design object 2010) and for a smaller metal design object (for example, distance 2060 between metal design object 2040 and smaller metal design object 2020). Further, because the software considers there to be two different metal design objects, it may require performing an unnecessary dead zone check. One or more embodiments of the present invention is a method that identifies artificial design objects by generating supplemental figures, i.e. TenthGrid boxes. In accordance with one embodiment of the inventive method, grow TenthGrid boxes at each vertex of a wide metal design object that lie outside the wide metal design object (refer to TenthGrid boxes 2070, 2071, 2074, and 2075 disposed at the vertices of wide metal design object 2010) where each of the TenthGrid boxes is a square with sides of length TenthGrid. Then, perform a DRC to determine whether any edge of the TenthGrid boxes overlays an edge of another design metal. As one can readily appreciate, an edge of TenthGrid box 2074 overlays an edge, of smaller metal design object 2020. Further, and in accordance with the present invention, since the overlap functions are performed with TenthGrid boxes, there is no confusion with real design data. This indicates that wide metal design object 2010 and smaller metal design object 2020 are part of the same metal design object. As a result, subsequent spacing checks will use the same distance, distance 2050 and distance 2060 will be equal.

Figure 4:
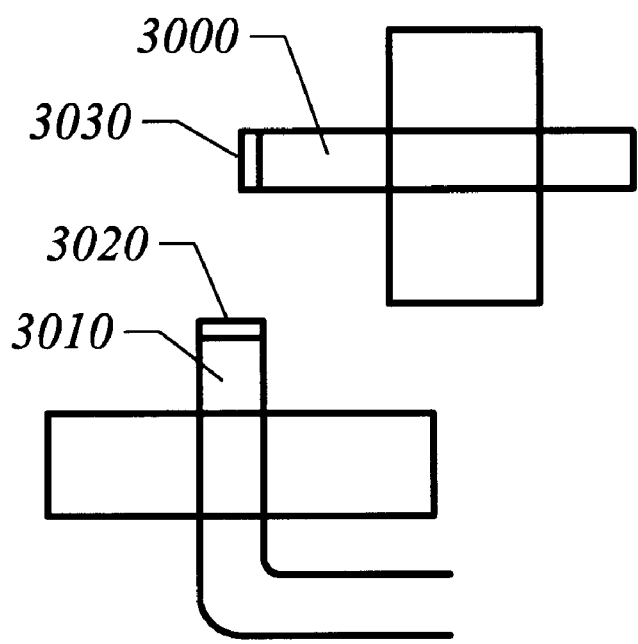
FIG. 4 shows a portion of a layer where a spacing check between gate extensions is performed.

The following provides another embodiment of the present invention that provides yet still another example of a method that uses a TenthGrid box. This embodiment provides a method for checking spacing between two design objects that are disposed at right angles with respect to each other. For example, FIG. 4 shows a portion of a layer where it is desired to check spacing between gate extensions 3000 and 3010. In accordance with one embodiment of the inventive method, grow TenthGrid boxes in from each edge of a gate extension to form TenthGrid boxes 3020 and 3030. Then, perform a spacing check between the end and sides of design objects. As one can readily appreciate, for TenthGrid boxes 3030 and 3020, this spacing check is, in essence, a spacing check between gate extensions 3000 and 3010. Further, and in accordance with the present invention, since the spacing check is performed with TenthGrid boxes, there is no confusion with real design data.

Those skilled in the art will recognize that the foregoing description has been presented for the sake of illustration and description only. As such, it is not intended to be exhaustive or to limit the invention to the precise form disclosed. For example, it is understood that different combinations of hardware may be used in constructing any of the computer based systems described herein, and that any of the computer based systems may comprise multiple computer platforms with separate CPU's or a single computer platform executing a software program as described herein.

What is claimed is:

1. A method for checking integrated circuit design files using (design rule check)/(electrical rule check) files (DRC/ERC files) wherein design objects are disposed on a grid having a system resolution, the method comprising steps of:
    growing one or more rectangular boxes having at least two sides of length equal to the system resolution outward or inward from one or more of an edge of a design object and a side of a design object;
    performing one or more of a spacing DRC/ERC check and an overlay DRC/ERC check; and
    identifying checks relating to the rectangular boxes.

2. The method of claim 1 wherein the system resolution is equal to one-tenth of a grid spacing.

3. The method of claim 1 wherein at least one of the rectangular boxes has four sides of length equal to the system resolution.

4. A method for checking integrated circuit design files using (design rule check)/(electrical rule check) files (DRC/ERC files) wherein design objects are disposed on a grid having a system resolution, the method comprising steps of:
    determining an amount equal to one-half of a predetermined width less the system resolution;
    decreasing a dimension of each side of design objects by the amount;
    increasing a dimension of each side of the design objects by the amount; and
    identifying narrow design objects as those that have disappeared.

5. A method for checking integrated circuit design files using (design rule check)/(electrical rule check) files (DRC/ERC files) wherein design objects are disposed on a grid having a system resolution, the method comprising steps of:
    determining a first amount equal to a predetermined amount plus the system resolution;
    determining a second amount equal to the predetermined amount less the system resolution; and
    identifying a length of an edge or side of a design object when the length is less than the first amount and greater than the second amount.

6. A method for checking integrated circuit design files using (design rule check)/(electrical rule check) files (DRC/ERC files) wherein design objects are disposed on a grid having a system resolution, the method comprising steps of:
    selecting design objects having an edge equal to a predetermined length;
    growing a rectangular box having two sides of length equal to the system resolution inside the edge;
    performing an enclosure operation; and
    identifying errors generated by the rectangular boxes.

7. A method for checking integrated circuit design files using (design rule check)/(electrical rule check) files (DRC/ERC files) wherein design objects are disposed on a grid having a system resolution, the method comprising steps of:
    growing rectangular boxes having at least two sides of length equal to the system resolution outward from sides of a polysilicon design object associated with MOS design objects;
    performing an overlap check between the rectangular boxes and a source design object and a drain design object associated with the MOS design objects; and
    identifying a partial gate whenever one or more of the rectangular boxes does not overlap the source design object or the drain design object.

8. A method for checking integrated circuit design files using (design rule check)/(electrical rule check) files (DRC/ERC files) wherein design objects are disposed on a grid having a system resolution, the method comprising steps of:
    growing rectangular boxes having at least two sides of length equal to the system resolution outward from edges of a polysilicon design object associated with MOS design objects;
    performing an overlap check between the rectangular boxes and a source design object and a drain design object associated with the MOS design objects; and
    identifying a partial gate whenever a rectangular box overlaps the source design object or the drain design object.

9. A method for checking integrated circuit using (design rule check)/(electrical rule (DRC/ERC files) wherein design objects are disposed on a grid having a system resolution, the method comprising steps of:
    growing rectangular boxes having at four sides of length equal to the system resolution outward from vertices of rectangular design objects;
    performing an overlap check between the rectangular boxes and the rectangular design objects; and
    identifying a notch whenever an overlap occurs between an edge of a rectangular box and an edge of a rectangular design object.

10. A method for checking integrated circuit design files using (design rule check)/(electrical rule check) files (DRC/ERC files) wherein design objects are disposed on a grid having a system resolution, the method comprising steps of:
    growing rectangular boxes having at least two sides of length equal to the system resolution inward from an end of design objects;

performing a spacing check between the ends and sides of design objects; and identifying a spacing check between ends of two objects by spacing checks involving rectangular design boxes.

11. A computer readable medium containing (design rule check)/(electrical rule check) files (DRC/ERC files) for checking integrated circuit design files wherein design objects are disposed on a grid having a system resolution, the computer readable medium comprising:

program instructions for growing one or more rectangular boxes having at least two sides of length equal to the system resolution outward or inward from one or more of an edge of a design object and a side of a design object;

program instructions for performing one or more of a spacing DRC/ERC check and an overlay DRC/ERC check; and program instructions for identifying checks relating to the rectangular boxes.

12. An apparatus for checking integrated circuit design files using (design rule check)/(electrical rule check) files (DRC/ERC files)wherein design objects are disposed on a grid having a system resolution, the apparatus comprising:

means for growing one or more rectangular boxes having at least two sides of length equal to the system resolution outward or inward from one or more of an edge of a design object and a side of a design object;

means for performing one or more of a spacing DRC/ERC check and an overlay DRC/ERC check; and means for identifying checks relating to the rectangular boxes.

* * * * *

UNITED STATES PATENT AND TRADEMARK OFFICE
CERTIFICATE OF CORRECTION

PATENT NO.     : 6,735,749 B2
DATED          : May 11, 2004
INVENTOR(S)    : Li et al.

It is certified that error appears in the above-identified patent and that said Letters Patent is hereby corrected as shown below:

<u>Title page,</u>
Please insert Item -- [*] Notice: Subject to any disclaimer, the term of this patent is extended or adjusted under 35 U.S.C. 154 (b) by 32 days. --.

Signed and Sealed this

Fifteenth Day of November, 2005

JON W. DUDAS
*Director of the United States Patent and Trademark Office*